(12) United States Patent
Erie et al.

(10) Patent No.: US 8,736,003 B2
(45) Date of Patent: May 27, 2014

(54) INTEGRATED HYBRID HALL EFFECT TRANSDUCER

(75) Inventors: David Erie, Cottage Grove, MN (US);
Noel Hoilien, Minneapolis, MN (US);
Steven Kosier, Lakeville, MN (US)

(73) Assignee: Allegro Microsystems, LLC, Worcester, MA (US)

(*) Notice: Subject to any disclaimer, the term of this patent is extended or adjusted under 35 U.S.C. 154(b) by 663 days.

(21) Appl. No.: 12/642,338

(22) Filed: Dec. 18, 2009

(65) Prior Publication Data

US 2011/0147865 A1 Jun. 23, 2011

(51) Int. Cl.
*H01L 29/82* (2006.01)

(52) U.S. Cl.
USPC ............ 257/421; 257/E43.002; 257/E43.003; 257/E43.007; 257/E27.005

(58) Field of Classification Search
None
See application file for complete search history.

(56) References Cited

U.S. PATENT DOCUMENTS

| 2,464,807 | A | | 3/1949 | Hansen, Jr. |
| 3,852,802 | A | | 12/1974 | Wolf et al. |
| 4,843,444 | A | | 6/1989 | Partin et al. |
| 5,153,557 | A | | 10/1992 | Partin et al. |
| 5,184,106 | A | | 2/1993 | Partin et al. |
| 5,241,197 | A | * | 8/1993 | Murakami et al. ............ 257/192 |
| 6,180,269 | B1 | * | 1/2001 | Hagi et al. .................... 428/697 |
| 6,452,239 | B1 | * | 9/2002 | McDowell et al. ........... 257/421 |
| 6,646,315 | B1 | * | 11/2003 | Johnson et al. ............... 257/429 |
| 6,683,359 | B2 | | 1/2004 | Johnson et al. |
| 7,396,736 | B2 | | 7/2008 | Jaouen et al. |
| 7,417,248 | B2 | | 8/2008 | Li |
| 2004/0224450 | A1 | * | 11/2004 | Itonaga et al. ................ 438/197 |
| 2005/0042814 | A1 | * | 2/2005 | Watanabe et al. ............ 438/202 |
| 2006/0048702 | A1 | * | 3/2006 | Son et al. ........................ 117/94 |
| 2006/0094182 | A1 | * | 5/2006 | Hanafi et al. .................. 438/199 |

OTHER PUBLICATIONS

Sze, S.M., Physics of Semiconductor Devices second edition. New York: John Wiley & Sons, Inc., 1981.*

* cited by examiner

*Primary Examiner* — Fei Fei Yeung Lopez
(74) *Attorney, Agent, or Firm* — Daly, Crowley, Mofford & Durkee, LLP

(57) ABSTRACT

A Hall effect transducer in a semiconductor wafer comprises a first layer of semiconducting material, a second layer of semiconducting material, and a contact structure configured to provide a path for electrical current to pass through the second layer. The second layer has higher electron hole mobility than the first layer, and is epitaxially grown atop the first layer.

15 Claims, 5 Drawing Sheets

INTEGRATED HYBRID HALL EFFECT TRANSDUCER

BACKGROUND

Transducers which make use of the Hall effect (a phenomenon that results in a voltage across a current-carrying element that is representative of a magnetic field transverse to the current) are common. These "Hall effect sensors" are integrated into a wide range of devices, from GPS trackers and cell phones to fluid flow monitors and rotational motion sensors. The electron mobility and electron hole mobility of the current-carrying element affects the sensitivity of the Hall effect sensor, with greater electron hole mobility in particular resulting in a more sensitive Hall effect sensor.

Hall effect transducers built into semiconductor wafers are common. These transducers typically involve a symmetrically electrically contacted plate or layer of a semiconducting material (a Hall plate) through which current is passed and across which voltage is monitored. Hall plates built into semiconductor wafers have traditionally been constructed of silicon.

SUMMARY

The present invention is directed toward a Hall effect transducer in a semiconductor wafer, comprising a first layer of semiconducting material, a second layer of semiconducting material, and a contact structure configured to provide a path for electrical current to pass through the second layer. The second layer of semiconducting material has higher electron hole mobility than the first layer, and is epitaxially grown atop the first layer.

DETAILED DESCRIPTION

Figure 1:
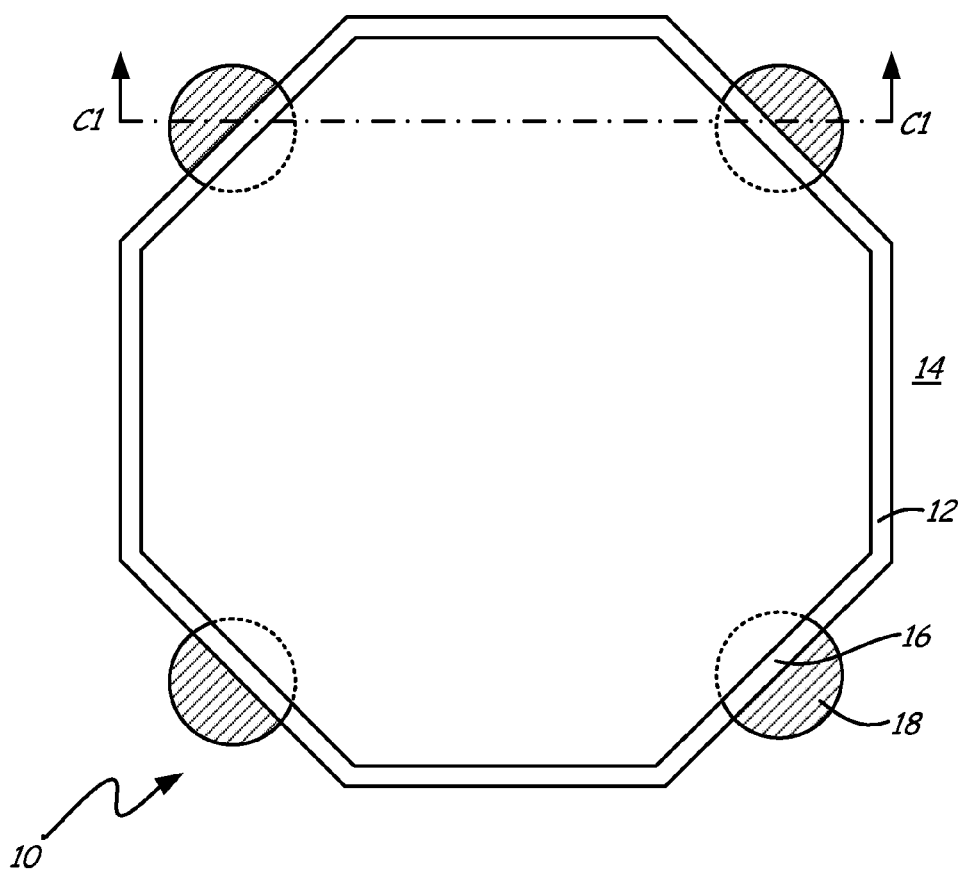
FIG. 1 is an overhead view of a Hall effect transducer, showing section line C1-C1.
Figure 2:
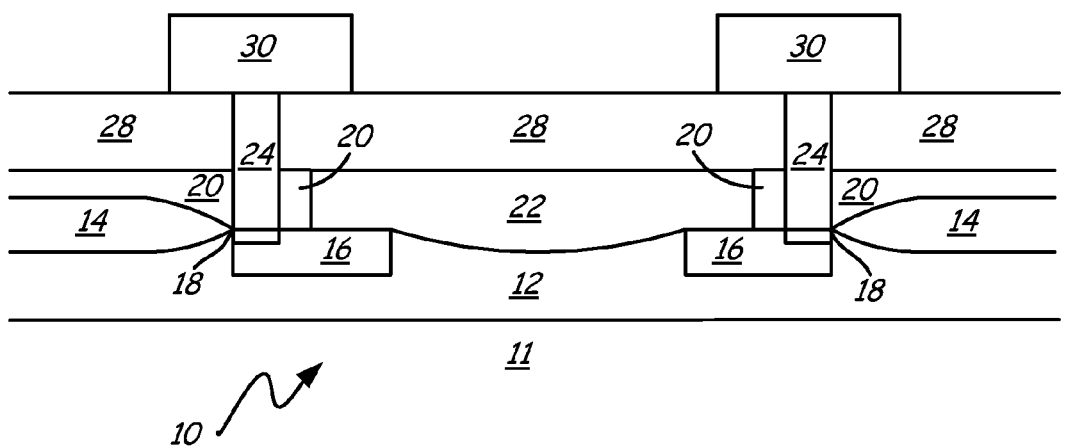
FIG. 2 is a cross-sectional view of the Hall effect transducer of FIG. 1, taken along section line C1-C1.

FIG. 1 is an overhead view, and FIG. 2 is a cross-sectional view taken along section line C1-C1, of hybrid Hall effect transducer 10 according to one embodiment of the present invention. FIGS. 1 and 2 show substrate layer 11, epitaxial layer 12, field oxide layer 14, N+ doped regions 16, crystalline conductor layers 18, plasma glass layer 20, Hall plate 22, contact plugs 24, contact glass 28, and metal connections 30.

Substrate 11 is comprised of a material common to the semiconductor wafer into which Hall effect transducer 10 is built. Epitaxial layer 12 is formed (of silicon, in one embodiment) on substrate 11, and Hall plate 22 is grown epitaxially from epitaxial layer 12. Hall plate 22 comprises a layer of a high electron hole mobility semiconductor (such as germanium, in one embodiment) which can be epitaxially grown.

A contact structure is formed to provide a path for electrical current to flow through Hall plate 22. In the embodiment shown in FIG. 2, this contact structure comprises N+ doped regions 16, crystalline conductor layer 18, and contact plug 24; it should be understood, however, that alternative embodiments may use a different contact structure to provide a path for electrical current to flow through Hall plate 22.

Doped N+ regions 16 are formed in epitaxial layer 12, partially underneath Hall plate 22 such that doped N+ regions 16 make contact with Hall plate 22 from below. Crystalline conductor layers 18 are formed on outer areas of N+ doped regions 16, separated from Hall plate 22. Field oxide layer 14 is formed atop epitaxial layer 12. Field oxide layer 14 and N+ doped regions 16 are covered by plasma glass 20, through which contact plugs 24 (comprised of metal) are formed as a conducting bridge between crystalline conductor layers 18 and metal connections 30, which are formed atop the structure of Hall effect transducer 10.

A current passed through Hall plate 22 via crystalline conductor layers 18 and N+ doped regions 16 will produce a voltage difference across Hall plate 22 whenever a perpendicular magnetic field intersects Hall plate 22. Because Hall plate 22 is formed of a semiconducting material with high electron hole mobility, it experiences a greater voltage drop for a given magnetic field than a similar Hall plate made of silicon would. This greater sensitivity to magnetic fields is useful; by reading the voltage across Hall plate 22, magnetic field strength can be measured more precisely than with Hall effect sensors previously used in integrated circuits. Hall plate 22 is only formed in the area of Hall effect transducer 10, and is formed atop a silicon layer potentially shared with the rest of the wafer. Thus, the material of Hall plate 22 can be easily incorporated into an integrated circuit.

Figure 3:
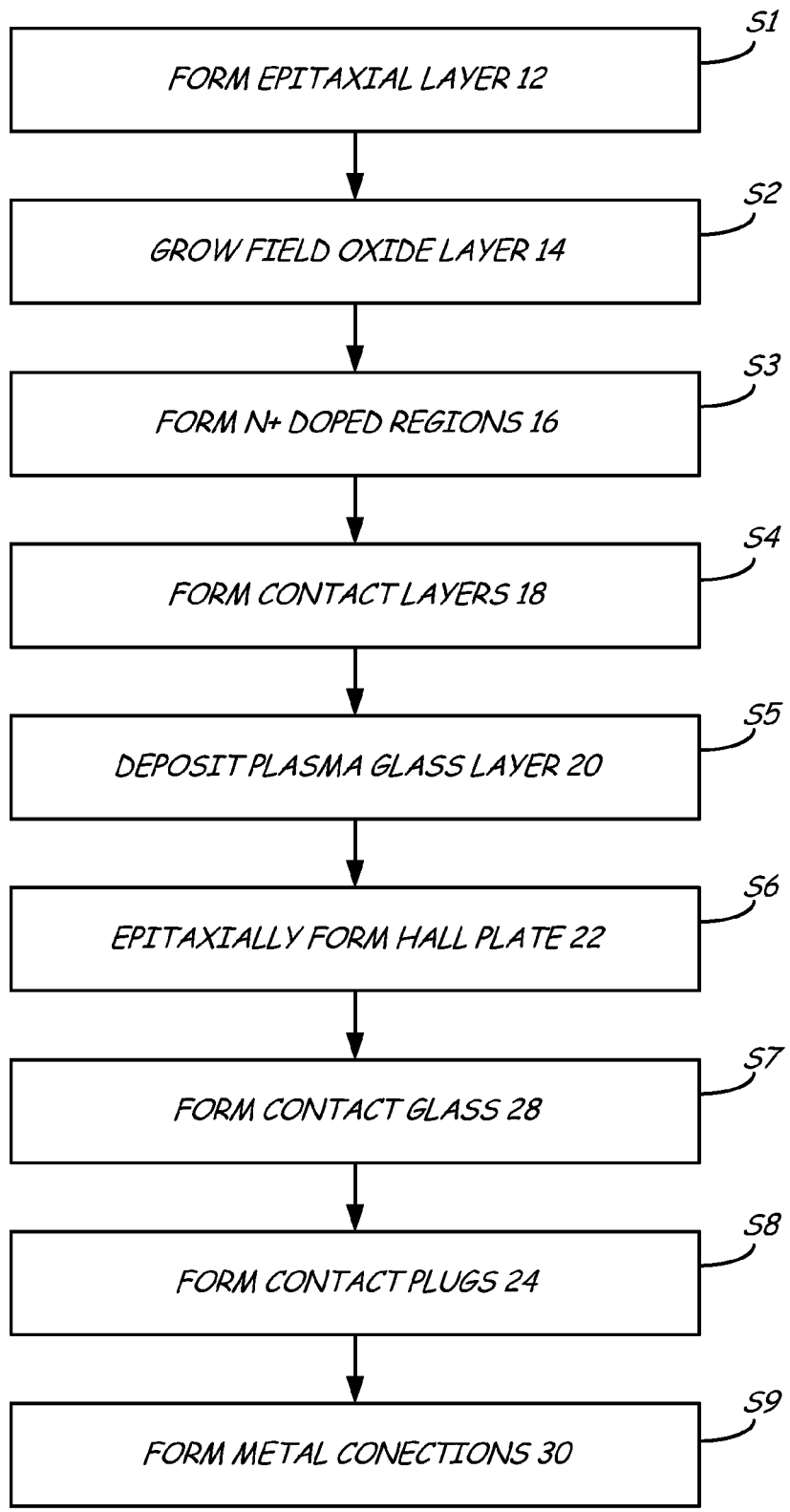
FIG. 3 is a flow diagram of a method for making the Hall effect transducer of FIG. 1.

FIG. 3 is a flow diagram illustrating a method for making Hall effect transducer 10. A more detailed description of each step, with corresponding diagrams, follows in FIGS. 4A, 4B, and 4C and the accompanying description. It should be understood that although the method shown in FIG. 3 is illustrative, other substantially equivalent methods could also be used to construct Hall effect transducer 10. The method shown in FIG. 3 includes the steps of forming epitaxial layer 12 (step S1), forming field oxide layer 14 (step S2), forming N+ doped regions 16 (step S3), forming crystalline conductor layers 18 (step S4), depositing plasma glass layer 20 (step S5), epitaxially forming Hall plate 22 (step S6), forming contact glass 28 (step S7), forming contact plugs 24 (step S8), and forming metal connections 30 (step S9).

Epitaxial layer 12 is first formed (step S1) atop substrate 11, whereupon field oxide layer 14 is grown on selected regions of epitaxial layer 12 (step S2). N+ doped regions 16 are then formed by ion implantation (step S3) in selected areas of epitaxial layer 12 not covered by field oxide layer 14. Steps S1 through S3 are shown in FIG. 4A and discussed in detail in the accompanying description.

Very thin crystalline conductor layers 18 (step S4) are formed in outer portions of N+ doped regions 16. Plasma glass layer 20 is then deposited over field oxide layer 14, the newly formed crystalline conductor layers 18, and N+ doped regions 16 (step S5). Steps S4 and S5 are shown in FIG. 4B and discussed in detail in the accompanying description.

Figure 4A:
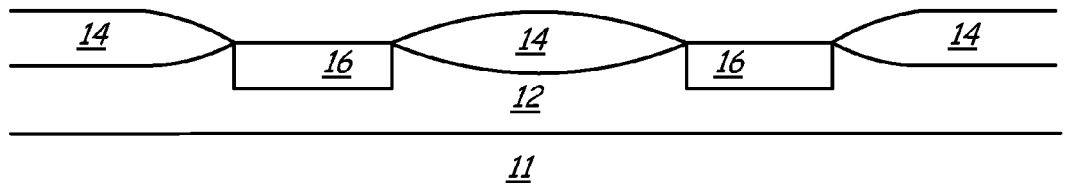
FIG. 4A is a cross-sectional view of the Hall effect transducer of FIG. 1, taken along section line C1-C1, in the early stages of its formation.
Figure 4B:
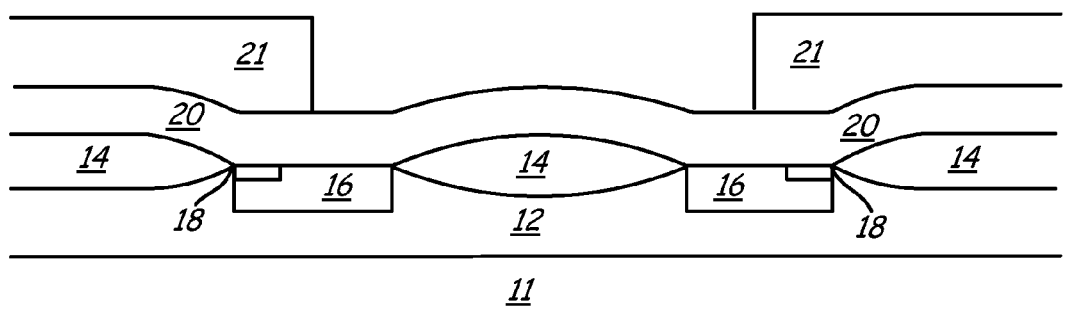
FIG. 4B is a cross-sectional view of the Hall effect transducer of FIG. 1, taken along section line C1-C1, in the middle stages of its formation.

Hall plate 22 is epitaxially grown atop epitaxial layer 12 and innermost portions of N+ doped regions 16 through mask 21 shown in FIG. 4B (step S6). Contact glass 28 is then formed over the entire structure (step S7), and trenches are etched from the surface of contact glass 28 down to crystalline conductor layers 18. Contact plugs 24 are deposited into these trenches (step S8), leaving a region of plasma glass layer 20 between contact plugs 24 and Hall plate 22. Metal connections 30 are formed to contact the tops of contact plugs 24 (step S9). Steps S6 through S9 are shown in FIG. 4C and discussed in detail in the accompanying description.

Figure 4C:
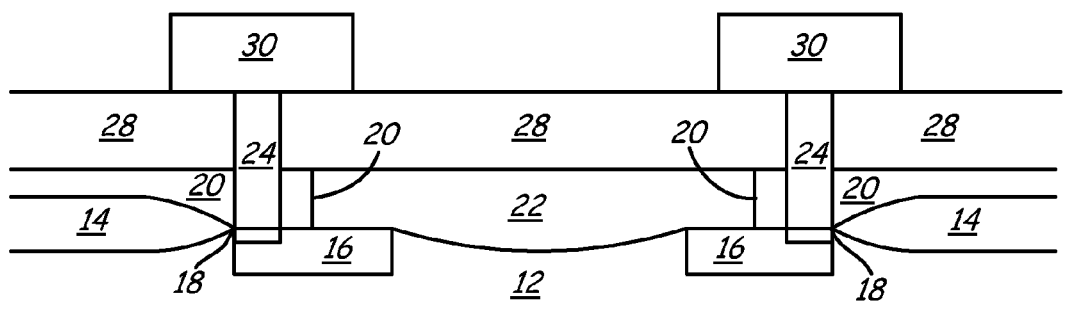
FIG. 4C is a cross-sectional view of the Hall effect transducer of FIG. 1, taken along section line C1-C1, in the final stages of its formation.

FIGS. 4A, 4B, and 4C show the stages enumerated in FIG. 3 for the formation of Hall effect transducer 10 of FIG. 1. FIG. 4A is a cross-sectional view of Hall effect transducer 10, along cut-away line C1-C1, in the early stages of its formation. FIG. 4A shows substrate 11, epitaxial layer 12, field oxide layer 14, and N+ doped regions 16.

Steps in the fabrication process of the Hall effect transducer are ordered so that high-temperature steps occur before low-temperature steps. This avoids exposing already-formed layers to high temperatures which might cause them to mix or be altered or destroyed.

An exemplary method for fabricating Hall effect transducer 10 begins with the deposition of epitaxial layer 12 atop substrate 11. Epitaxial layer 12 is formed of negatively doped silicon, or a similar material in common with the rest of the semiconductor wafer or integrated circuit. The material of epitaxial layer 12 is selected such that Hall plate 22 (see FIG. 4C) can be grown epitaxially on epitaxial layer 12.

Field oxide layer 14 is next grown atop epitaxial layer 12. Field oxide 14 is formed by masking the areas where N+ doped region 16 will eventually be formed, e.g. with a nitride layer (not shown), and then growing field oxide 14 in the unmasked region. Once field oxide layer 14 has been formed, the nitride layer is removed. N+ doped region 16 is formed by ion implantation into epitaxial layer 12. In an alternative embodiment, N+ doped region 16 may be formed before field oxide layer 14 is deposited.

FIG. 4B is a cross-sectional view of Hall effect transducer 10, along cut-away line C1-C1, in the next stages of its formation. FIG. 4B shows substrate 11, epitaxial layer 12, field oxide layer 14, N+ doped regions 16, crystalline conductor layer 18, plasma glass layer 20, and mask 21.

Crystalline conductor layers 18 are formed once N+ doped regions 16 are complete. Crystalline conductor layers 18 provide a low resistance between N+ doped region 16 and a metal contact to a current source. In one embodiment crystalline conductor layers 18 are comprised of CoSi2, which is formed by depositing CoTi through a salicide mask, heat cycling to form a thin layer of CoSi2 where the CoTi layer contacts the silicon of N+ doped region 16, and etching away the remaining CoTi. In other embodiments, other materials which serve to lower resistance between N+ doped region 16 and contact plug 24 (see FIG. 4C) could be used instead of CoSi2. Because the formation of crystalline conductor layers 18 by heat cycling requires exposure of all deposited layers to high temperatures, this step is performed early in the production of the Hall effect transducer, before (and therefore beneath) Hall plate 22 (see FIG. 4C).

Once crystalline conductor layers 18 are formed, plasma glass layer 20 is deposited over field oxide layer 14, crystalline conductor layers 18, and N+ doped region 16. Plasma glass layer 20 is formed at low temperatures; in one embodiment, plasma glass layer 20 is formed by plasma-enhanced chemical vapor deposition (PECVD), so as to avoid temperatures that would be harmful to previously deposited layers. Plasma glass layer 20 may be comprised of tetraethyl orthosilicate glass, or of another form of plasma glass which can be formed at low temperatures. Mask 21 is then formed over plasma glass layer 20, and the unmasked portions of plasma glass layer 20 and field oxide layer 14 are etched away. Hall plate 22 (FIG. 4C) will eventually make contact with N+ doped region 16 in this unmasked, etched region, and will be grown wherever epitaxial layer 12 and N+ doped region 16 is not masked by plasma glass layer 20 and mask 21.

FIG. 4C is a cross-sectional view of Hall effect transducer 10, along cut-away line C1-C1, in the final stages of its formation. FIG. 4C shows substrate layer 11, epitaxial layer 12, field oxide layer 14, N+ doped regions 16, crystalline conductor layers 18, plasma glass layer 20, Hall plate 22, contact plugs 24, contact glass 28, and metal connections 30.

Hall plate 22 is formed on the region of epitaxial layer 12 unmasked by plasma glass 20 and mask 21 (FIG. 4B), and comprises a high-mobility semiconductor such as germanium. Because Hall plate 22 is grown epitaxially, it is comprised of a material that can be grown on epitaxial layer 12. After forming Hall plate 22, mask 21 is removed. Contact glass 28 is formed at low temperatures (by PECVD, in one embodiment) atop the entire resulting structure, whereupon narrow trenches are etched from the top surface of contact glass 28 down to crystalline conductor layers 18, exposing the top surfaces of crystalline conductor layers 18. These narrow trenches are no wider than necessary to expose the top surfaces of crystalline conductor layers 18. Contact plugs 24 are formed in these trenches to serve as a contact between crystalline conductor layers 18 (and thereby Hall plate 22) and current carrying metal connections 30, which are deposited atop the transducer structure. Because of the positioning of crystalline conductor layers 18, contact plugs 24 are separated from Hall plate 22 by a region of plasma glass layer 20. In one embodiment, contact plugs 24 are comprised of tungsten. Metal connections 30 are comprised of a conductor such as copper.

In the completed structure, current runs from one or more metal connections 30 through one or more contact plugs 24, crystalline conductor layers 18, and N+ doped regions 16 into Hall plate 22, through Hall plate 22, and then out through opposite N+ doped regions 16, crystalline conductor layers 18, contact plugs 24, and metal connections 30. So long as current runs through Hall plate 22, Hall effect transducer 10 serves as a sensor, providing a voltage drop proportional and highly sensitive to intersecting magnetic fields.

Figure 5:
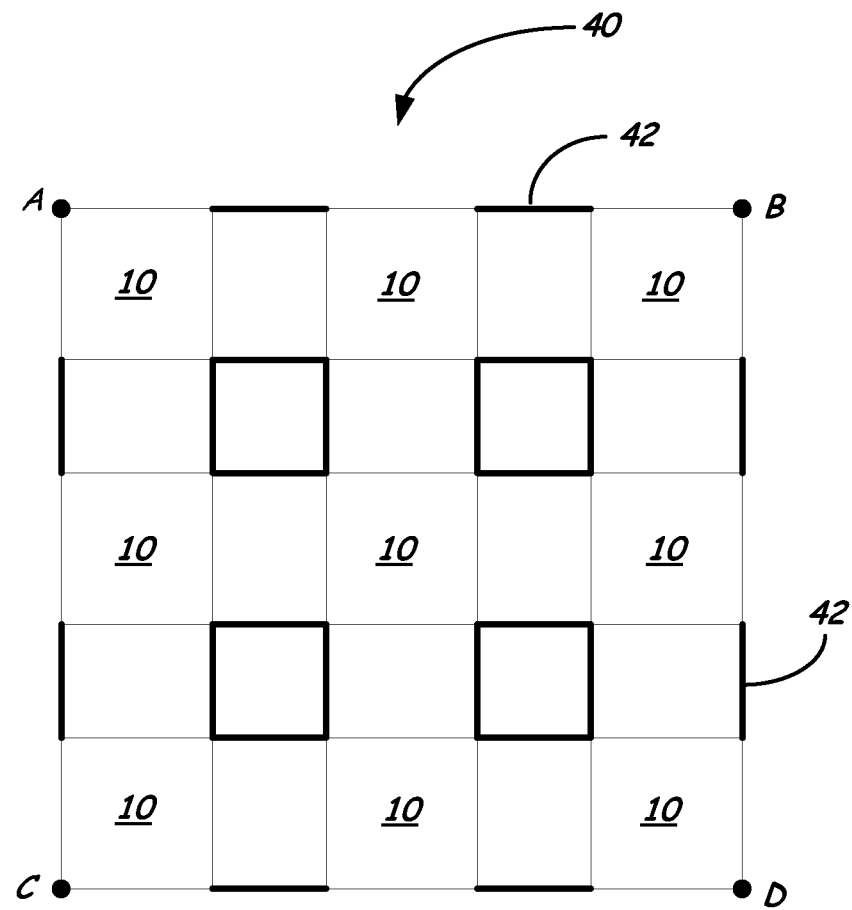
FIG. 5 is a diagram illustrating an exemplary layout of a 3×3 matrix of Hall effect transducers forming a four-terminal Hall effect sensor.

The discussion above describes the formation of a single Hall effect transducer (having a Hall plate formed with high electron mobility material). However, the present invention may also be configured with multiple Hall effect transducers making up a Hall effect sensor. FIG. 5A is a diagram illustrating an exemplary layout of a 3×3 matrix of Hall effect transducers 10 forming a four-terminal Hall effect sensor 40 with terminals A, B, C and D. Hall effect transducers 10 are arranged in a matrix with interconnects 42 connected between them. In some applications, utilizing an array of Hall effect transducers 10 in Hall effect sensor 40 provides improved performance. Other configurations of multiple Hall effect transducers are also contemplated.

Exemplary methods of forming Hall effect transducer 10 have been described with respect to the formation of a single transducer for the sake of simplicity. However, it should be understood that in most applications, the methods of forming Hall effect transducer 10 will be applied in such a way that multiple transducers are formed in a mass fabrication process. The extension of the single transducer method described herein to a mass fabrication process is within the expertise of a skilled artisan, and is therefore not described in detail.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A Hall effect transducer in a semiconductor wafer, comprising:
    a first layer of semiconducting material;
    a second layer of semiconducting material comprising germanium with higher electron hole mobility than the first layer, epitaxially grown on the first layer; and
    a contact structure configured to provide a path for electrical current to pass through the second layer, wherein the contact structure comprises a set of electrical contacts that contact the second layer from beneath the second layer, a voltage across the set of electrical contacts representing an external magnetic field intersecting the Hall effect transducer.

2. The Hall effect transducer of claim 1, wherein the first layer is common to the entire semiconductor wafer.

3. The Hall effect transducer of claim 1, wherein the electrical contacts comprise doped regions of the first layer.

4. The Hall effect transducer of claim 3, wherein the contact structure further comprises layers of crystalline conductor material formed on the doped regions of the first layer.

5. The Hall effect transducer of claim 1, wherein the contact structure further comprises a set of conductive plugs configured to pass current from above the Hall effect transducer to the electrical contacts that contact the second layer from beneath.

6. The Hall effect transducer of claim 1, further comprising at least one glass layer isolating the second layer from other regions of the semiconductor wafer.

7. A Hall effect sensor comprising a plurality of Hall effect transducers as claimed in claim 1 interconnected together.

8. A method for constructing a Hall effect transducer in a semiconductor wafer, comprising the steps of:
    forming a first layer of epitaxial semiconductor material;
    forming a second layer of semiconductor material comprising germanium with greater electron hole mobility than the first layer, atop and in contact with the first layer; and
    forming a contact structure configured to provide a path for current to be passed through the second layer, the contact structure comprising a set of doped contact regions located in the first layer, in contact with the second layer from beneath the second layer, a voltage across the set of electrical doped contact regions representing an external magnetic field intersecting the Hall effect transducer.

9. The method of claim 8, wherein the first layer is deposited upon a substrate shared by the rest of the semiconductor wafer.

10. The method of claim 9, wherein the first layer is common to the entire wafer.

11. The method of claim 8, wherein the first layer is comprised of silicon.

12. The method of claim 8, wherein the contact structure further comprises a layer of a crystalline conductor material formed on the doped contact regions.

13. The method of claim 12, wherein the crystalline conductor material is comprised of CoSi2.

14. The method of claim 8, further comprising: forming at least one glass layer to isolate the second layer from other regions of the semiconductor wafer.

15. The method of claim 8, wherein the contact structure further comprises tungsten plugs allowing current to be passed through the doped contact region and the second layer of semiconductor material.

* * * * *